INVENTOR.
John C. Haenichen

BY
Mueller, Aichele & Rauner
ATTY'S.

HIGH FREQUENCY TRANSISTOR HAVING A BASE REGION SUBSTRATE

INVENTOR.
John C. Haenichen
BY
Mueller, Aichele & Rauner
ATTY'S.

United States Patent Office
3,454,846
Patented July 8, 1969

3,454,846
HIGH FREQUENCY TRANSISTOR HAVING A BASE REGION SUBSTRATE

John C. Haenichen, Scottsdale, Ariz., assignor to Motorola, Inc., Franklin Park, Ill., a corporation of Illinois
Continuation-in-part of application Ser. No. 254,651, Jan. 29, 1963. This application Jan. 3, 1967, Ser. No. 607,047
Int. Cl. H01l *11/00, 15/00, 3/00*
U.S. Cl. 317—235 3 Claims

ABSTRACT OF THE DISCLOSURE

A high frequency transistor having a base region substrate with a collector region adjacent a first surface; the base region extending to such first surface and an emitter region extending into the substrate in a closely spaced apart relation to the collector region forming a pair of parallel junctions. The base region being the substrate facilitates common base circuit configurations for high frequency applications.

This application is a continuation-in-part of the now abandoned application Ser. No. 254,651, filed Jan. 29, 1963.

This invention relates in general to semiconductor devices and more particularly to the manufacture of high frequency planar transistors.

High frequency transistors present a number of problems in manufacture in that the active semiconductor element of a typical high frequency transistor requires an extremely small geometrical configuration to operate properly. This is due to the low capacitances that must be attained in order to have a satisfactory high frequency device.

A high frequency transistor should not only be able to perform as required in the frequency range for which it was designed but obviously from a manuacturing viewpoint it should be an easy device to make and shold be a high yield device, that is, one which has a design and a manuacturing process such that the percentage of reject devices in production is small. Unfortunately, many of the characteristics desired in high frequency transistors have been more or less mutually exclusive in that operational requirements frequently tended to make the devices harder to make and to reduce the production yield. Generally, for a particular transistor type, i.e., mesa, planar, etc., manufacturing problems are more numerous and difficult as higher frequency devices are designed. Many of these problems revolve about the fact that the active regions of high frequency transistors are extremely small and therefore more care must be exercised in processing. Typically, the dimensions of the active regions of these devices are smaller than the tolerances on the dimensions of the more accurate components of a fine watch, and therefore the margin for error in locating one region of the transistor relative to another, attaching leads, etching materials away, forming junctions, etc., is very small.

Good high frequency characteristics in a transistor would require at least that the device have a narrow base width, small junction capacitances, and a low base resistance. However, as the base widths become narrower in the conventional transistor, the base resistance of the device tends to be rather high due to the resulting decrease in the base cross section. In an attempt to decrease the collector capacitance of the devices, higher resistivity base material and also high resistivity collector regions are employed toward this end. Both of these approaches have problems associated with them. The obvious one, in the case of the high resistivity base material is that the base resistance is also increased and in the case of the collector region, this increases the series resistance of the collector which is undesirable in most transistors regardless of their operating frequency. The emitter resistance should also be low. The higher resistivity base and collector resigions also tend to cause the gain of the transistor to vary with the current flowing through it.

In the case of planar transistors, especially high frequency planar transistors, there are a number of critical registrations or alignments of the semiconductor material relative to certain photolithographic tools which are used in fabricating these devices. These registrations are more difficult as the devices become smaller. The margin for error is especially small in cases where several dependent registrations must be made as the errors in this case are cumulative.

In addition to the usual problems involved in the fabrication of high frequency transistors, those high frequency transistors employed in integrated circuitry are somewhat more difficult to fabricate because some of the connections to the contacts of the transistor are frequently awkward to make. It would be desirable in most integrated circuits if all of the connections to a transistor could be made from a single surface as is presently possible only in planar transistor structures; usually the silicon substrate has only two major surfaces and one of these is most often entirely used in bonding the substrate to some object such as a header.

Accordingly, one of the objects of this invention is to provide a high frequency transistor that can be manufactured simply but will still meet the necessary requirements of having a narrow base width, low collector capacitance, low base resistance and low series emitter and collector resistance.

Another object of this invention is to provide a method for fabricating high frequency transistors having an improved geometrical design that are easier to manufacture with high yields and with the consequent low cost.

A feature of this invention is the method of selectively diffusing both a base region and an emitter region through the same opening in the silicon dioxide or glass diffusion masks to improve the degree of control of device geometry and reduce the number of photolithographic operations.

In accordance with this invention, high frequency transistors of an excellent type may be fabricated utilizing two selective diffusions through the same opening in the diffusion masking material, thereby creating a device which satisfies a number of requirements which are critical in high frequency transistors. The two diffusions through this same opening in the oxide are the base diffusion and emitter diffusion.

Figures 1, 2, 3, 4, 5, 6, 11:
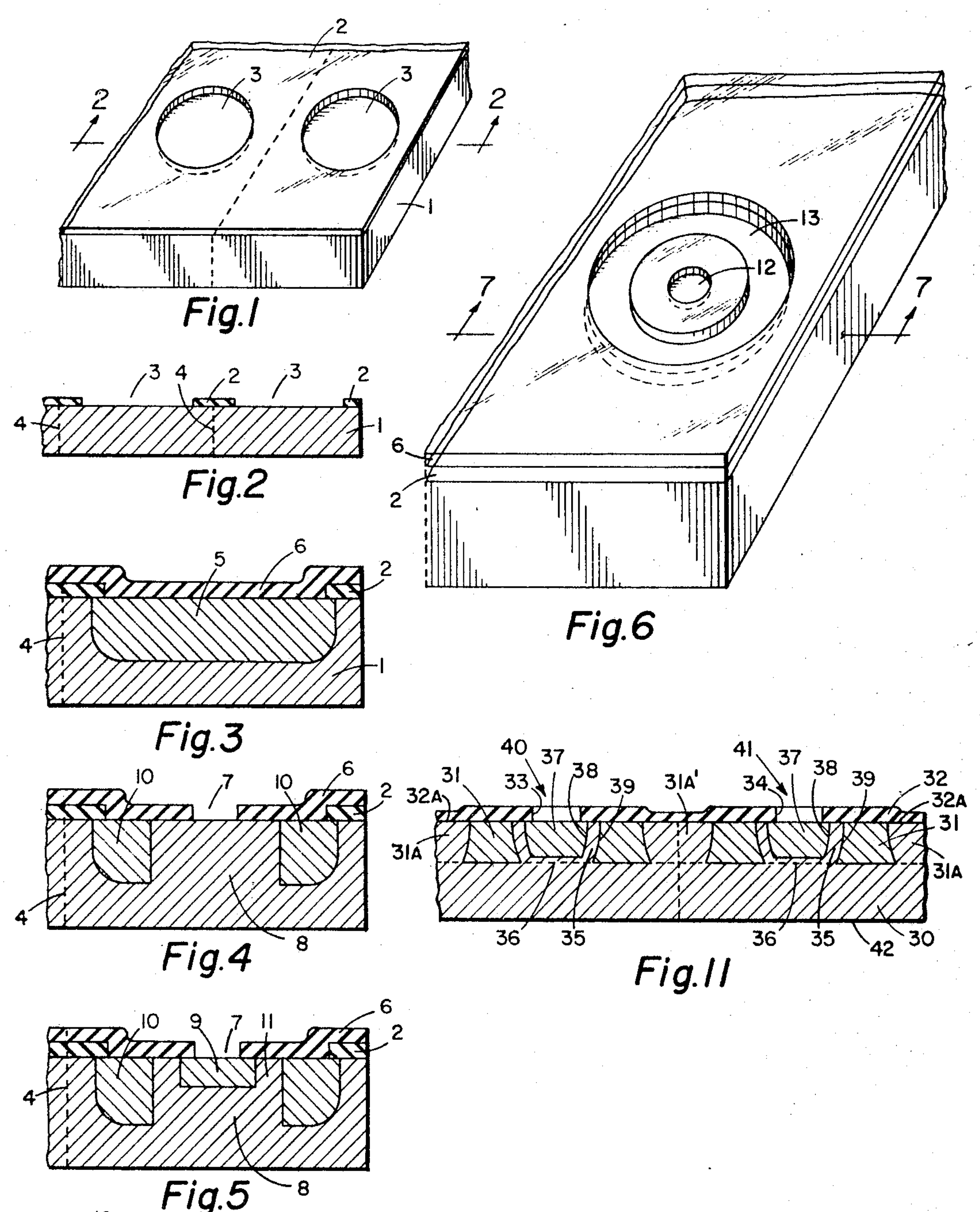
FIG. 1 shows a portion of a silicon dioxide coated wafer of P type silicon with holes etched in the silicon dioxide for selective diffusion process.
FIG. 2 shows a cross section of the wafer of FIG. 1.
FIG. 3 shows in cross section one-half of the same wafer as shown in FIG. 2, but following a solid state diffusion of N impurity into the wafer through the open regions of the silicon dioxide.
FIG. 4 is another cross sectional view of the same portion of the wafer with a hole etched in the region of the glass film which was formed during the diffusion of the N impurity in the silicon and after a P-type diffusion through the hole in the oxide has been completed.
FIG. 5 shows the same cross sectional view after an N diffusion has been selectively performed through the same hole in the oxide.
FIG. 6 shows an isometric view of the device after openings in the silicon dioxide have been prepared for metallizing the collector and emitter.
FIG. 11 illustrates a similar device in cross section except that such device is designed for high reverse breakdown voltage across the collector-base junction.

The accompanying drawings and the following text detail the invention. FIG. 1 is an isometric drawing of a wafer of P type silicon 1 upon which a layer of silicon dioxide 2 has been grown and a number of holes 3 for selective diffusion purposes have been etched in the silicon dioxide. In FIG. 2 a sectional view through the wafer has been taken along line 2—2 to show the same structure more clearly. The silicon dioxide 2 will mask against a subsequent diffusion of arsenic impurity, which is a relatively slow diffusant, into the silicon. The dashed lines 4 indicate where the wafer will be cut or otherwise separated into individual semiconductor units. Diffusion masking materials such as silicon dioxide are shown only on the upper surface of the transistor in order to simplify the drawings. However, it should be understood that in practice all regions of the transistor that are not to be diffused are coated with silicon dioxide or other suitable material.

FIG. 3 shows the structure after the diffusion through the hole has been made. The diffusion formed an N type region 5, and, as is apparent, a film 6 was formed as a part of the diffusion processing. This is a silicon dioxide film formed by oxidizing the hot silicon by exposure to water vapor during the arsenic diffusion. The oxide material has properties such that it will inhibit the diffusion of boron impurities into the underlying silicon and it will be used as a diffusion mask against boron. The techniques mentioned in this paragraph are well known in the art.

FIG. 4 shows a cross sectional view of the same region of the wafer as in FIG. 1 but after a new hole 7 has been etched into the silicon dioxide which now covers the previously existing holes. This hole 7 is shown approximately concentric with the original hole 3 in the silicon dioxide 2. A boron diffusion has been made and the boron has been selectively diffused through the hole 7 and has created a P region 8 extending from the surface of the wafer through the N material and to the original P material. Note that no silicon dioxide or glass film is shown covering the surface of the silicon within the hole 7. This is to point out that care is taken in this case to use diffusion techniques which minimize silicon dioxide or glass formation on the silicon surface at this point. If a borosilicate glass is used as the P type impurity source, it must be kept thin enough that it is ineffective as a diffusion mask against a subsequent N type diffusion.

FIG. 5 shows the same cross secton as before except that an N diffusion to form the N type emitter 9 and establish the thickness of the base 11 has been performed selectively through the hole 7 in the phosphosilicate glass. The N material that is used in this case is a fast diffusant in silicon such as phosphorus in order that the collector and base diffusions are not appreciably altered by the time and temperature involved in this emitter diffusion.

Figure 7:
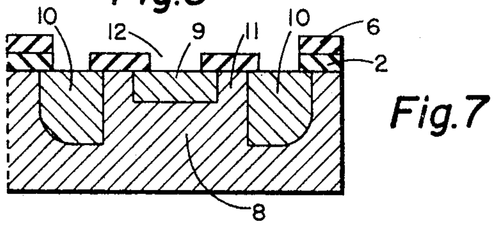
FIG. 7 shows a sectional view of FIG. 6 taken along line 7—7.

FIG. 6, an isometric view, and FIG. 7, a sectional view, show the additional regions of silicon dioxide 12 and 13 that have been removed at the surface of the device so that metal contacts may be applied to these inner and outer N regions of the transistor; the outer N region is the collector 10 of this transistor and is annular and is shown concentric with the emitter 9 and the spreading region 11 of the base.

Figure 8:
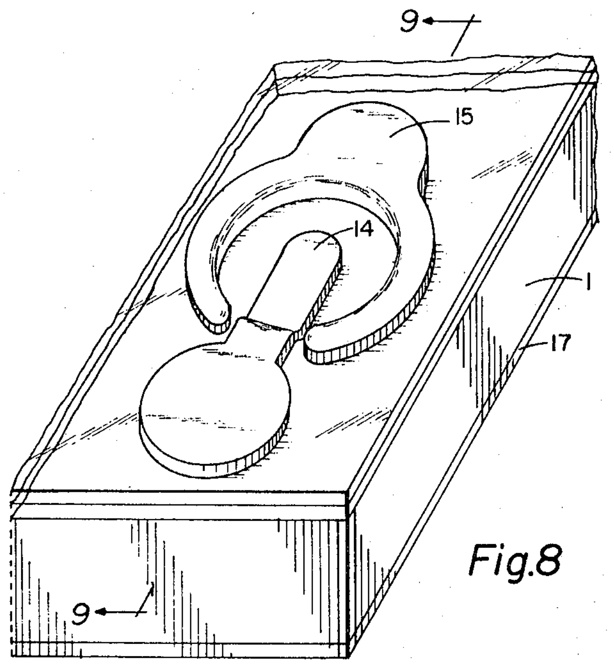
FIG. 8 shows an isometric view of the device of FIG. 6 after the collector, emitter and base contacts have been placed on the transistor.
Figure 9:
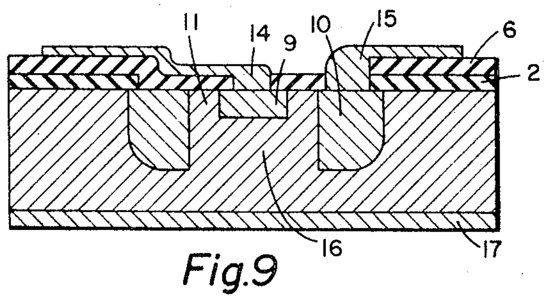
FIG. 9 shows a sectional view of FIG. 8 taken along line 9—9.

The collector and emitter regions of the device are metallized by high vacuum evaporation techniques to form contacts as shown in FIG. 8 and FIG. 9. The metallization is done on the transistor so that the metal emitter and collector contacts 14 and 15 extend onto the insulating film of silicon dioxide 6 in order to provide a larger contact region. The vacuum evaporations for both emitter and collector metallizing may be done at the one time without added steps. Aluminum is used for these emitter 14 and collector 15 contacts. The cross section in FIG. 9 shows the relative position of the constituent parts of the device. Note that the spreading region 11 of the total base region is also annular since this region lies in the cylindrical portion of the device between the emitter 9 and collector 10. This base region has a low resistance as it has a very large section 16 leading to the more active portion of the base lying between the outer region of the outer wall of the emitter cylinder and the inner wall of the collector cylinder. The region of the base between the emitter and the collector is usually of an intermediate resistivity so that the breakdown voltage is high and the collector capacitance is low, but obviously the transistor base resistance may be kept very low without reducing the resistivity of this region by having a very low resistivity P region between this base region and the metal base contact 17 at the bottom of the device. The upper region of the transistor die in which the collector, base and emitter diffusions are accomplished should then be a P region with a P+ region lying underneath. The P+ region may be formed by diffusion on a P wafer, or alternatively a P region may be epitaxially grown on a P+ wafer of silicon. The base contact 17 of gallium doped gold substantially covers the bottom of the P+ region.

Because of the fact that the emitter and collector regions may be metallized substantially at the regions where maximum transistor action is taking place, the device tends to have very low emitter and collector series resistances. There is additional collector capacitance due to some extraneous collector surface, but due to the construction of the device the non-critical portions of the base outside of the base cylinder 11 but near the collector may be made of relatively high resistivity bulk material to form there a wider depletion region and thus reduce this collector capacitance without appreciably affecting the resistance of the base, the most active portion of which is the diffused cylinder 11. This is done, in fact, so that low collector capacitances are maintained without any significant increase in the base resistance of the device.

After metallizing the device is mounted to a conventional transistor header (not shown) in much the same way as the conventional planar or mesa type of transistor except that where normally a collector connection to a header is made by alloying or soldering the collector to the header structure, in this device it is in the base portion that is so attached, the base contact rather than the collector being at the bottom of the die as is usual in the more conventional planar or mesa devices. The base lead of the header is connected to the base portion of the header rather than the usual collector lead of the header. This is a decided advantage if the transistor is employed with the base grounded, which is the usual way in high frequency applications since this provides the highest gain with the least noise. This eliminates the usual wire connection between the header and the base contact thus reducing the inductance of the transistor, and as a result the value of the maximum frequency at which the device may be operated is increased. Thermocompression bonding, customarily used for making connection to metallized contacts on the smaller planar and mesa devices, is used for wire attachment using aluminum wire to the emitter and collector of this device.

When used for integrated circuits the basic transistor structure as described is very conveniently made in a slightly different way on an integrated circuit substrate of silicon. Rather than doing an N type collector diffusion initially, a base region is selectively diffused first through a disk-shaped hole in a silicon dioxide film on the substrate. This is a P diffusion using borosilicate glass as a diffusion source. A hole is etched in the borosilicate glass which has a masking action against the diffusion of phosphorus and then the diffusion of phosphorus for forming the N type collector is made. The steps for making this device from this point are exactly as in the previous device. The final device structure has concentric base, collector and emitter contacts at the surface of the substrate where it is easy to make connection to them and thus is ideal for integrated circuits where much of the circuit is at the surface of the silicon substrate.

Only conventional fabrication techniques are required for fabricating these devices and the basic diffusion technique required for this device is the well known one of selective diffusion which is simply the use of silicon dioxide and certain glasses which are used as masks against the diffusion by a certain impurity. The base region is metallized by evaporating on gold which is alloyed to the silicon after the wafers have been cut into individual transistor units or dice. In this operation, a die is placed on a gold plated transistor header made of Kovar or an equivalent material and heated above the gold-silicon eutectic temperature. This accomplishes the alloyed contact to the silicon as well as the bond of the semiconductor die to the transistor header. The emitter and collector of the device are very small so the well-known "overmetallization" technique is used to make contact to them. Aluminum is evaporated onto exposed or bare regions of the emitter and collector silicon and is also allowed to extend over onto the silicon dioxide to form larger contact areas. The aluminum is very active and aided by the heating of the silicon wafer it chemically bonds to the silicon dioxide as well as makes alloyed contact to the silicon of the emitter and collector where the silicon dioxide was removed. The concentrations of N impurity at the emitter and collector is made sufficiently high during the diffusions so that PN junctions are not formed by the aluminum.

The base width control for this device is exceptional because the same diffusion mask is used both for the base and the emitter diffusion. The base diffusion, of course, is such that the periphery of the hole in the silicon dioxide determines the location of the collecting surface which is largely the inside diameter of the collector cylinder. The emitter being diffused through the same hole has its cylindrical emitting surface referenced exactly to the collector surface. Obviously, since the same hole in the mask of glass and silicon dioxide is used for both diffusions, any local errors in the shape of the hole will reproduce in both diffusions so that the effect of irregularities is not nearly so pronounced. Where normally an irregularity in a diffusion mask might produce a lateral spike-like portion extending close to the collector of the device, this is not so adverse in the present transistor since the same irregularity is produced in the collector junction as well, so that the separation between the two opposed regions at the irregularity tends to be about the same as at the regions of the junctions at the more even edges of the hole in the glass.

While the structures shown in the drawings have cylindrical geometries, it should be obvious from the previous paragraph that cylindrical geometries are not essential to the use of the method of this invention. The hole through which the emitter and base region and the collector, for that matter, are diffused might readily be of a square, star-shaped or any other desirable geometry since the general relationship of the emitter to the collector junctions tends to be preserved with this system. It should also be clear that the invention described is not limited to the fabrication of NPN devices since by using appropriate materials, PNP devices may be made in a similar manner.

Figure 10:
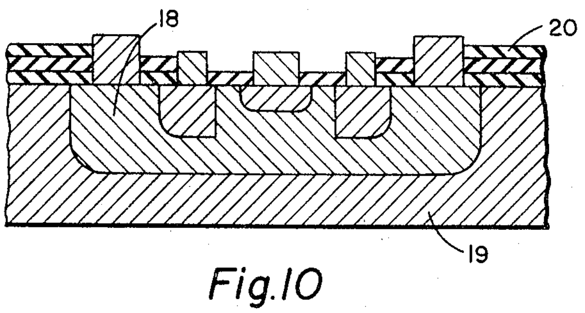
FIG. 10 shows a design of a similar device in cross section except it is adapted for integrated circuitry purposes on a silicon substrate.

The basic device described herein is well suited for integrated circuitry since emitter, base and collector contacts may all be at one surface as desired. FIG. 10 represents the device when fabricated on an isolated base region 18 on a substrate 19 of high resistivity silicon. The base region in this case was formed by selective diffusion and the transistor is electrically isolated by the high resistivity of the substrate 19. An additional diffusion masking film of glass or silicon dioxide 20 is represented due to the extra selective diffusion step in forming the base region in the substrate.

A typical NPN device fabricated according to this invention would have an initial film of silicon dioxide of about 10,000 Angstrom units thick. The oxide film during the selective arsenic diffusion is grown to a thickness of about 5,000 Angstrom units thick since it has a masking function for the subsequent collector diffusion. The diffused N type collector region would have a surface concentration of about $10^{20}$ atoms per cubic centimeter after compensation of the previously P doped material. A wafer of about 5 mils thickness would have a collector cylinder of about 3.6 mils OD and an ID of about 0.6 mil and would be about 3 microns in depth. The emitter cylinder which is concentric with the collector cylinder would be of about 0.55 mil diameter and would have a depth of about 2 microns. The emitter would have a surface concentration of N type impurity atoms of $5\times10^{20}$ atoms per cubic centimeter after compensation of P type atoms. The base resistance at the surface as a result of the base diffusion and measured prior to the emitter diffusion would have a sheet resistance of about 100 ohms per square. When borosilicate glass is used as an impurity source for the base diffusion it covers the opening provided in the oxide for both base and emitter diffusions, so it is usually kept less than 500 Angstrom units thick in order that it is largely ineffective in masking against the subsequent phosphorus emitter diffusion. The upper or epitaxial portion of the base which would have an initial resistivity of 0.5 ohm-centimeter while the lower region of the die, also P type, on which the epitaxial region was grown would have initially a resistivity of 0.01 ohm-centimeter.

The following values are typical of the electrical constants of this device. It has a base resistance of about 20 ohms, a collector capacitance of about 1.0 picofarads. It has a series resistance for the collector of about 30 ohms and a series resistance for the emitter of about 3 ohms. A device of about these approximate characteristics is a good high frequency amplifier up to frequencies of about $10^9$ cycles per second.

It is known that diffusions into semiconductor material always have a higher doping, i.e., lower resistivity than the supporting material. Such low resistivity when used in the collector and base regions of transistors reduce the reverse breakdown voltage of the collector-base junction. By using high resistivity material for the collector and/or the base region, the reverse breakdown voltage of such devices is increased. A device having a high resistivity collector region is illustrated in FIG. 11. Substrate 30, either P or N type material, has a high resistivity (N or P) epitaxial layer 31 of opposite conductivity type material grown thereon. Layer 31 will be used to form collector regions as later described. Over layer 31 there is deposited an insulating oxide layer 32. Then annular rings (not shown) are removed from oxide layer 32 exposing rings of layer 31 surface as at 32A. Then the impurity of substrate 30 (P or N) is diffused through the rings and epitaxial layer 31 forming a plurality of annular isolating rings 31A. In FIG. 11 there is one ring 31A in device 40 and one in device 41. The two illustrated rings 31A, as shown, have a common leg 31A′ no limitation thereto intended. The diffusion is performed in an oxidizing atmosphere to form the reduced thickness portions of oxide layer 32. Additional oxide may be added as desired.

In the next step of forming the FIG. 11 structure, apertures 33 and 34, respectively in devices 40 and 41, are etch cut through oxide layer 32 exposing portions of layer 31 surface. The transistor using this invention is then completed by the following described diffusion steps.

An impurity is diffused through the apertures 33 and 34 into the epitaxial layer 31 in a reducing atmosphere. This diffusion uses the same type of impurity as contained in substrate 30 to form surface reaching portions 35 (one in each device) of base region or substrate 30. The junction 39 formed by the boundary of layer 31 (to be the collector region) and substrate 30 now extends to the surface under oxide layer 32 and is therefore passivated. Dotted line 36 indicates the original junction between layer 31 and substrate 30. After portions 35 have been diffused through the epitaxial layer 31, emitter regions 37 are selectively diffused through apertures 33 and 34 to form emitter regions 37, as shown. Since emitter regions 37 have the same conductivity type as epitaxial layer 31 and are diffused through the same apertures 33 and 34, the geometrical configurations of the rectifying junctions 38 formed between emitter regions 37 and the base region portions 35 are closely similar as the inner portions of rectifying junctions 39 formed between the epitaxial layer 31 and base surface reaching portions 35. In this manner a plurality of transistors 40 and 41 is formed having high frequency characteristics for grounded base circuit configurations without registration problems with respect to the extremely-thin constant-thickness base region portions 35 formed between parallel portions of junctions 38 and 39. The electrical characteristics of devices 40, 41 are determined primarily by the relationships of junctions 38, 39 with thin base portion 35 therebetween. The substrate 30 portions of the total base regions (substrates 30 plus portions 35) act as good electrical base connections through metallized layer 42, formed in any known manner.

After completion of the above described steps, each device 40, 41 may be separated as individual devices in a known manner. It is to be understood that by suitable modification the structure of FIG. 11 may be used in integrated circuits.

The construction of the embodiment in FIG. 11 may be compared to the construction of all diffused region transistors previously described in that the formation of the epitaxial layer 31 is comparable to the process step of FIG. 3, the formation of region portions 35 is comparable to the step shown in FIG. 4 and the formation of the emitter regions is comparable to the step shown in FIG. 5.

Transistors according to this invention are improved in many respects over present passivated transistors without sacrifice of their more desirable characteristics.

Specific reference is made to the fact that the character of the junctions of these present passivated devices have been improved and preserved by films of glass or silicon dioxide where these junctions are in contact with the sensitive outer surfaces of the transistor element. This invention retains these protective passivating features of the passivated devices and so that transistors made according to it have the low reverse currents, low noise and the good stability associated with such features.

As is apparent, this is a superior method for making high frequency transistors and one which gives high yields at no increase in cost and additionally is readily adaptable for integrated circuit use as well.

I claim:

1. A high frequency transistor which comprises:

(a) a base region having a first conductivity type, said base region having first and second major surfaces;

(b) an annular collector region having a second conductivity type formed in said base region and extending inwardly from the first surface of the base region, the inwardly extending portion of said collector region being bounded by the first conductivity type base region;

(c) an emitter region having a second conductivity type formed in the portion of said base region bounded by the annular collector region, said emitter region being spaced from said collector region;

(d) an insulating film formed on the first major surface of said base region, said film having at least two apertures therein to permit contact to the emitter and collector region of the transistor, and (e) means for making electrical contact to the base region.

2. The high frequency transistor of claim 1 wherein said means for making electrical contact to the base region substrate comprises a base contact formed on the second major surface of said base region.

3. The high frequency transistor of claim 2 wherein the spacing of the emitter and collector regions is of the order of 0.00005 inch.

References Cited

UNITED STATES PATENTS 3,271,201 8/1966 Pomerantz --------- 148—33.3

JOHN W. HUCKERT, *Primary Examiner.*

M. EDLOW, *Assistant Examiner.*

U.S. Cl. X.R.

317—234